(12) United States Patent
Pettersen et al.

(10) Patent No.: US 11,962,290 B2
(45) Date of Patent: Apr. 16, 2024

(54) CORRECTION UNIT FOR RADIO FREQUENCY FILTER

(71) Applicant: Kongsberg Defence & Aerospace AS, Kongsberg (NO)

(72) Inventors: Bjørn Holst Pettersen, Oslo (NO); Stig Rooth, Asker (NO)

(73) Assignee: Kongsberg Defence & Aerospace AS, Kongsberg (NO)

( * ) Notice: Subject to any disclaimer, the term of this patent is extended or adjusted under 35 U.S.C. 154(b) by 442 days.

(21) Appl. No.: 16/975,073

(22) PCT Filed: Mar. 8, 2019

(86) PCT No.: PCT/EP2019/055828
§ 371 (c)(1),
(2) Date: Aug. 21, 2020

(87) PCT Pub. No.: WO2019/170853
PCT Pub. Date: Sep. 12, 2019

(65) Prior Publication Data
US 2020/0403602 A1    Dec. 24, 2020

(30) Foreign Application Priority Data
Mar. 8, 2018 (NO) .................................. 20180338

(51) Int. Cl.
*H03H 9/64* (2006.01)
*H01P 3/08* (2006.01)
(Continued)

(52) U.S. Cl.
CPC ............ *H03H 9/6489* (2013.01); *H01P 3/08* (2013.01); *H03H 7/0115* (2013.01); *H03H 9/25* (2013.01)

(58) Field of Classification Search
CPC ...... H03H 9/6489; H03H 9/25; H03H 7/0115; H01P 3/08
See application file for complete search history.

(56) References Cited

U.S. PATENT DOCUMENTS

| 7,791,436 B2 | 9/2010 | Bardal et al. |
| 2002/0000897 A1* | 1/2002 | Huor .................. H03H 9/14538 |
| | | 310/313 C |

(Continued)

FOREIGN PATENT DOCUMENTS

| EP | 1935094 B1 | 1/2009 |
| EP | 2590326 A2 | 5/2013 |

(Continued)

OTHER PUBLICATIONS

Trafidlo, Renata; International Search Report; PCT/EP2019/055828; dated Jun. 21, 2019; 5 pages.

(Continued)

*Primary Examiner* — Samuel S Outten
(74) *Attorney, Agent, or Firm* — Bradley Arant Boult Cummings LLP

(57) ABSTRACT

The present invention relates to a filter correction unit (203a) as well as an RF filter including the correction unit for use in radio frequency transmission lines including a band pass filter (201) having input and output interfaces mounted in the signal transmission line. The filter (201) is chosen so as to transmit signals within a predetermined frequency range, the quality factor of the filter having predetermined limitations generating a known distortion to the signal. The correction unit (203a) has a first bus connected to said transmission line and to said filter, wherein the correction unit comprises at least one surface acoustic wave (SAW) transducer (204a-n), each transducer having two electrodes on a piezoelectric substrate where a first electrode is connected to said first bus and the other electrode connected to (Continued)

a second bus, the SAW transducer being adapted to distort a transmitted signal with a factor being the inverse of said known distortion of the filter (201).

19 Claims, 6 Drawing Sheets

(51) Int. Cl.
*H03H 7/01* (2006.01)
*H03H 9/25* (2006.01)

(56) References Cited

U.S. PATENT DOCUMENTS

| | | |
|---|---|---|
| 2012/0119847 A1 | 5/2012 | Iwaki et al. |
| 2014/0113571 A1 | 4/2014 | Fujiwara et al. |
| 2015/0319536 A1 | 11/2015 | Detlefsen et al. |
| 2016/0191012 A1 | 6/2016 | Khlat et al. |
| 2016/0191014 A1 | 6/2016 | Khlat et al. |
| 2017/0201233 A1 | 7/2017 | Khlat |
| 2017/0222622 A1* | 8/2017 | Solal ................ H03H 9/02574 |
| 2017/0301992 A1 | 10/2017 | Khlat et al. |
| 2018/0323485 A1* | 11/2018 | Gnanou ............ H01P 1/20345 |

FOREIGN PATENT DOCUMENTS

| | | |
|---|---|---|
| JP | S60-019230 U | 2/1985 |
| JP | S60-223314 A | 11/1985 |
| JP | S61-065615 A | 4/1986 |
| JP | H07-176978 A | 7/1995 |
| JP | H09-205336 A | 8/1997 |
| JP | H09-214284 A | 8/1997 |
| JP | 2000-357903 A | 12/2000 |
| JP | 2002158504 A | 5/2002 |
| JP | 2005-176338 A | 6/2005 |
| JP | 2006-261964 A | 9/2006 |
| JP | 2013-070272 A | 4/2013 |
| JP | 2015-154434 A | 8/2015 |
| WO | WO-2018003296 A1 | 1/2018 |

OTHER PUBLICATIONS

Miraftab, Vahid, et al.; "Advanced Coupling Matrix and Admittance Function Synthesis Techniques for Dissipative Microwave Filters"; IEEE Transactions on Microwave Theory and Techniques, vol. 57, No. 10; Oct. 2009; pp. 2429-2438.

Yu, Ming, et al.; "Predistortion Technique for Cross-Coupled Filters and Its Application to Satellite Communication Systems"; IEEE Transactions on Microwave Theory and Techniques, vol. 51, No. 12; Dec. 2003; pp. 2505-2515.

Yu, Ming, et al.; "Shrinking Microwave Filters"; IEEE Microwave Magazine; Oct. 2008; pp. 40-54.

Padilla, Alberto, et al.; "Comparison of lossy filters and predistorted filters using novel software"; IEEE MTT-S International Microwave Symposium Digest; Jun. 2010; pp. 1720-1723.

Da Cunha, Mauricio Pereira; "Pseudo and High Velocity Pseudo SAWs"; International Journal of High Speed Electronics and Systems, vol. 10, No. 4; Dec. 2000; 5 pages.

Odagawa, Hiroyuki, et al.; "Low Loss Wide Band Microwave Filters Using SAW Devices Combined with Mircrostrip Lines"; 2011 IEEE International Ultrasonics Symposium Proceedings; Oct. 2011; pp. 1329-1332.

Gómez-Garcia, Roberto, et al.; "Hybrid surface-acoustic-wave/microstrip signal-interference bandpass filters"; IET Microwaves, Antennas & Propagation, vol. 10, No. 4; Mar. 2016; pp. 426-434.

Morgan, David; "Surface Acoustic Wave Filters With Applications to Electronic Communications and Signal Processing," Second Edition; Elsevier Ltd., Oxford, UK; ISBN: 978-0-1237-2537-0; Jan. 2007; 448 pages.

\* cited by examiner

CORRECTION UNIT FOR RADIO FREQUENCY FILTER

The present invention relates to the use of one or more surface acoustic wave (SAW) transducers for filter correction in radio frequency applications, especially within or close to the microwave range.

FIELD OF INVENTION

The presented invention relates in general to the field of radio frequency apparatus, in particular to radio frequency filters and in more particular to radio frequency filters employing acoustic wave devices.

DESCRIPTION OF RELATED ART

In a wide range of communication systems, and in particular for communication satellite systems, high performance radio frequency (RF) filters are required to effectively utilize the available frequency spectrum. These applications generally require filters with a very flat passband (little variation in insertion loss over the filter passband), good rejection band suppression and a steep transition into the rejection band while also maintaining a low mass and small size. When designing high performance RF filters the achievable electrical performance is typically limited by the quality factor (Q-factor) of the used resonator technology, with high-Q technologies typically imposing penalties in terms of the filter mass and size. In some applications, such as for filters used after a low noise amplifier (LNA) at the receiver end of a communication system, the filter requirement related to the average insertion loss level is relaxed as losses associated with the filter can be compensated for by increasing the gain of the LNA. In these applications, a high Q is primarily required to realize a sharp transition band edge, good passband performance and a steep transition into the rejection band. As a result, multiple filter design techniques have been developed to leverage this relaxation in insertion loss requirements to improve the passband performance of RF filters, thereby potentially reducing the required Q factor of incorporated resonators, and consequently the size and mass of corresponding RF filters. These design techniques typically rely on pre-distortion and lossy filter design principles as described below.

In classical lossless filter design, where an infinite resonator Q is assumed, the desired filter response is typically defined from polynomial functions whose roots correspond to the transmission poles and zeroes of the resonators incorporated in the filter. When realized, a filter designed using lossless synthesis techniques will exhibit shifts in the transmission polynomial roots due to the finite Q of used resonators, which generally results in a degradation of the lossless response as characterized by nonzero insertion loss and a reduction in passband performance through the rounding of transition band edges. A pre-distortion technique introduces shifts in the transmission poles of the designed filter to compensate for the shift introduced by finite Q values as discussed in references [1] [2]. This effectively introduces a curvature in the passband of the lossless response countering the curvature introduced when realizing the network with finite-Q resonators. A disadvantage of the pre-distortion design technique is that it results in a significant return loss degradation while also increasing the insertion loss [3].

While pre-distortion based design techniques modify the polynomial functions defining the filter response, lossy design techniques apply non-uniform dissipation, added and or redistributed loss and modified filter topologies to improve the passband performance of a filter while sacrificing insertion loss. Lossy filter synthesis techniques described in the literature generally start with a lossless (infinite-Q) filter topology realizing the poles and zeroes of the lossless polynomial description of the desired filter response. Dissipative elements are subsequently added to the exterior of the lossless filter network and similarity transforms applied to the network to redistribute losses in the network, resulting in a modified filter topology with dissipative cross couplings and resonators of finite Q [1] [4]. Lossy filter design strategies relying on the numerical optimization of filter networks with dissipative cross couplings have also been reported in the literature. Common for reported lossy filter networks is the introduction of dissipative cross couplings, which potentially increases the filter complexity.

An alternative method for sacrificing insertion loss to improving the passband performance of an arbitrary filter without severely degrading return loss performance or introducing complex filter topologies with dissipative cross couplings is to connect a filter to a matched frequency dependent loss inducing element with increased dissipative properties in the passband frequency range of the connected filter relative to frequencies outside the passband. If the dissipation profile of the loss-inducing element is shaped such that it counters the insertion loss variations in the passband of the connected filter, the losses introduced by the element may correct the filter response to produce an overall network response with reduced passband insertion loss variation. The invention presented in the following sections realizes such a loss-inducing element through the use of surface acoustic wave (SAW) transducers, acting as frequency dependent admittances. As known to a person skilled in the art and illustrated in FIGS. 1a and 1b illustrating prior art, a SAW transducer has two electrodes on a piezoelectric substrate, where each electrode corresponds to a set of finger structures 101,102 overlapping with the electrode fingers of the other electrode. By connecting one transducer electrode to the input- or output-terminal of a filter and the other electrode to ground, or if used with a balanced four port filter to the second input- or output-terminal, frequency dependent losses may be introduced in the passband of the filter. As will be discussed in the following sections, the dissipation profile of one or more SAW transducers may be tailored to match the passband of a connected filter through the manipulation of the electrode finger geometry. SAW transducers may also be placed in the interior of a connected filter to both replace shunt connected capacitive elements in a filter and to selectively introduce losses in the filter passband.

It has previously been demonstrated that surface acoustic wave (SAW) resonators can be used to selectively introduce losses in the form of a notch in a connected filter. U.S. Pat. No. 7,791,436 B2 and European patent no. 1935094 describe a filter combined with SAW resonators connected to ground to introduce a notch response in or near the passband of the filter. At low frequencies, outside the acoustically active region of the SAW resonator, the resonator response is approximately equal to that of a capacitor, thus enabling the substitution of capacitive elements in the connected filter. For increasing frequencies, the resonator response will transition into a short circuit state near the resonance frequency, before transitioning to an open circuit state near its anti-resonance frequency. For frequencies beyond anti-resonance, the resonator will again transition back to a state approximating a capacitive element. A grounded SAW resonator will therefore introduce a notch in the connected filter response near the resonance frequency. This notch is typically deep, on the order of tens of dB, due to the high admittance at resonance, and steep due to the high Q-factor of SAW resonators. While SAW resonators can be combined to form a broadband notch response, where a shunt connected ladder type configuration is one example, the shape of this notch is not easily manipulated. The peak admittance of resonator based notch elements are also generally too high when shallow corrections on the order of a dB are desired.

The invention as described in following sections instead relies on shunt connected SAW transducers to induce losses in a connected filter since the admittance of a SAW transducer is easily shaped through conventional SAW design techniques known to a person skilled in the art. The peak admittance of a SAW transducer is also several orders of magnitude smaller than that of a SAW resonator with comparable transducer aperture, enabling corrections on the order of a dB in a connected filter.

When designing passive microwave filters there exist excellent methods (and mathematic descriptions) in case of lossless elements. Once bringing loss into the elements, degradation like rounded passband amplitude edges and degradation in the return loss (from that given in the lossless description) occur. Prior art know techniques are pre-distortion (first order approximation to compensate for losses) and lossy filter synthesis [3]. The current patent application deals with this problem, but the approach is quite different. Instead of having a high complexity network with cross couplings, the complexity is put into SAW elements, the SAW correction elements, with the main objective of equalization the passband response and meanwhile having a good return loss without sacrificing too much insertion loss. The present invention both deals with the passband correction of filters using acoustic elements, and to correct the passband of filters described in the present background.

When neglecting resistive losses in the metal pattern of a SAW transducer, the transducer admittance can be described by:

$$Y_{SAW}(\omega) = G_a(\omega) + jB_a(\omega) + j\omega C_t$$

Where $Y_{SAW}(\omega)$ is the transducer admittance, $G_a(\omega)$ the acoustic conductance, $B_a(\omega) = G_a(\omega)*1/\pi\omega$ (here indicating the convolution product) the acoustic susceptance and $C_t$ the transducer capacitance. $G_a(\omega)$ and $B_a(\omega)$ are generally of the same order of magnitude. Outside the acoustically active region of the transducer $G_a(\omega)$ and $B_a(\omega)$ are approximately zero, and the transducer admittance can be approximated from its transducer capacitance. In the acoustically active region the acoustic conductance and susceptance increases, resulting in a relative increase in the transducer admittance. If one SAW transducer electrode is connected to a transmission line, and the other connected to ground, the transmission line will exhibit increased dissipation in the acoustically active region of the transducer due to the increased transducer admittance in this frequency regime. The shape and magnitude of the relative increase in the dissipation profile is primarily dictated by the acoustic conductance and susceptance, which is defined by the finger pattern of the transducer electrodes [5]. By employing conventional SAW design techniques as discussed above, the acoustic conductance and susceptance may be tailored through the manipulation of the transducer electrodes, thereby producing a dissipation profile that can be exploited to correct the passband response of a connected RF filter.

One alternative technique for use primarily in wireless systems is shown in US application 2016/0191012, which describes an RF ladder filter using a capacitance compensation connected in parallel to a first capacitance in order to compensate for the first parallel capacitance and thus to increase the anti-resonance frequency and provide an adequate bandwidth to the preferred passband. An object of the present invention aimed at reducing the variation within the passband without needing to increase the bandwidth.

SUMMARY OF THE INVENTION

The above objectives are achieved as defined in the accompanying claims.

With the present invention, the main attention is to compensate the filter's passband including a good return loss due to, mentioned are but not restricted to, finite loss of the filter's resonators (SAW/BAW/XBAR and/or electrical microwave based). Roughly speaking, the filter's passband is flattened out meanwhile a good return loss is obtained only by sacrificing insertion loss roughly in the magnitude of the filter's amplitude ripple. Within the frame of the present approach, the passband width is roughly unchanged. Other parameters like the level of the stopband and the steepness of the transition band are not significantly influenced. Since this concept works with different filter realization, SAW/BAW/XBAR resonators having both resonance and anti-resonance frequencies and electrical microwave resonators having only resonance frequencies, it cannot rely on techniques of modifying the internal elements like changing their Q-values and/or compensate their electrical loading conditions, e.g. as in the abovementioned US2016/019012, being mentioned but not restricted to, the prior art knowledge of reducing the external/internal static capacitance of SAW/BAW/XBAR which increase the frequency separation between the resonance and anti-resonance frequencies which makes it possible to increase the filter bandwidth.

This way a filter correction is provided by connecting an arbitrary RF filter with an input- and output-terminal, or in the case of a four port RF filter with two input- and output-terminals, with correction units comprising one or more surface acoustic wave transducers, acting as frequency dependent admittances, with a piezoelectric substrate and two electrodes per transducer on the surface of the substrate, where one electrode is connected to a bus, the bus being connected between the input- and output- of the correction unit, one interface being connected to the filter, and the other electrode connected to a second bus, the bus being connected to ground, or when combined with a balanced four port filters between the second input- and output- of the correction unit, one of which being connected to the filter. SAW transducers may also be connected to the interior of a filter to both replace shunt connected capacitive elements and to selectively introduce losses in the filter passband. The surface acoustic transducers maybe combined with inductive and capacitive elements to reduce impedance mismatch between the transducers and the connected filter.

Outside its acoustically active region a SAW transducer will act as a capacitor, thereby introducing broadband perturbations in the response of the connected filter. In the acoustically active region the admittance of the SAW transducers will increase due to an increase in the transducers acoustic admittance, thereby introducing a relative increase in power directed towards ground, or in the case of balanced four port filters towards the terminal connected to the second SAW transducer electrode. If the acoustically active region coincides with the passband frequency range of the connected filter the network will exhibit a dip in its passband response, where the shape and magnitude of the dip is dictated by the acoustic admittance of the SAW transducer. The shape and magnitude of the acoustic admittance can be accurately controlled by manipulating the electrode finger pattern of the SAW transducer, and can be tailored to the passband response of the connected filter through conventional SAW design techniques, thereby reducing insertion loss variations in the passband of the connected network at the expense of increased insertion loss.

The invention will be described in more detail below with reference to the accompanying drawings, illustrating the invention by way of examples.

Figure 3:
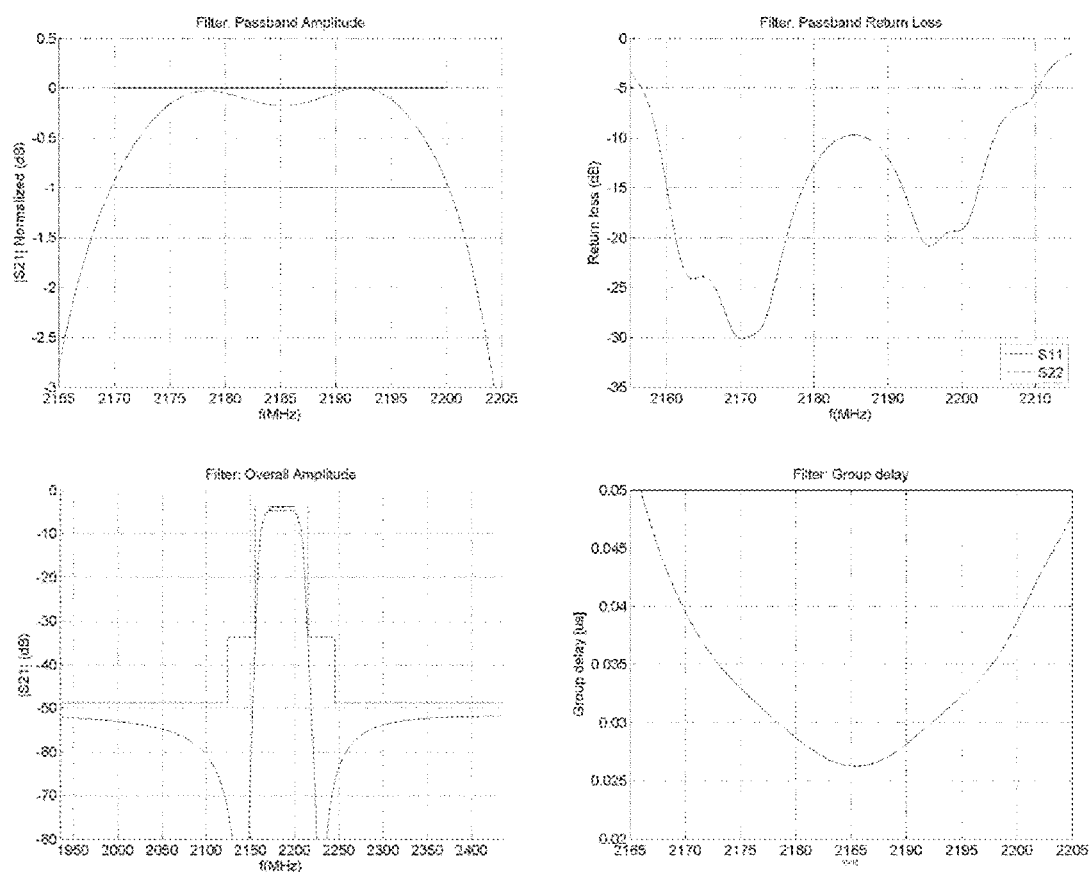

FIG. 3: illustrates the response of a SAW impedance element filter (IEF) before connecting it to the correction unit.

Figure 4:
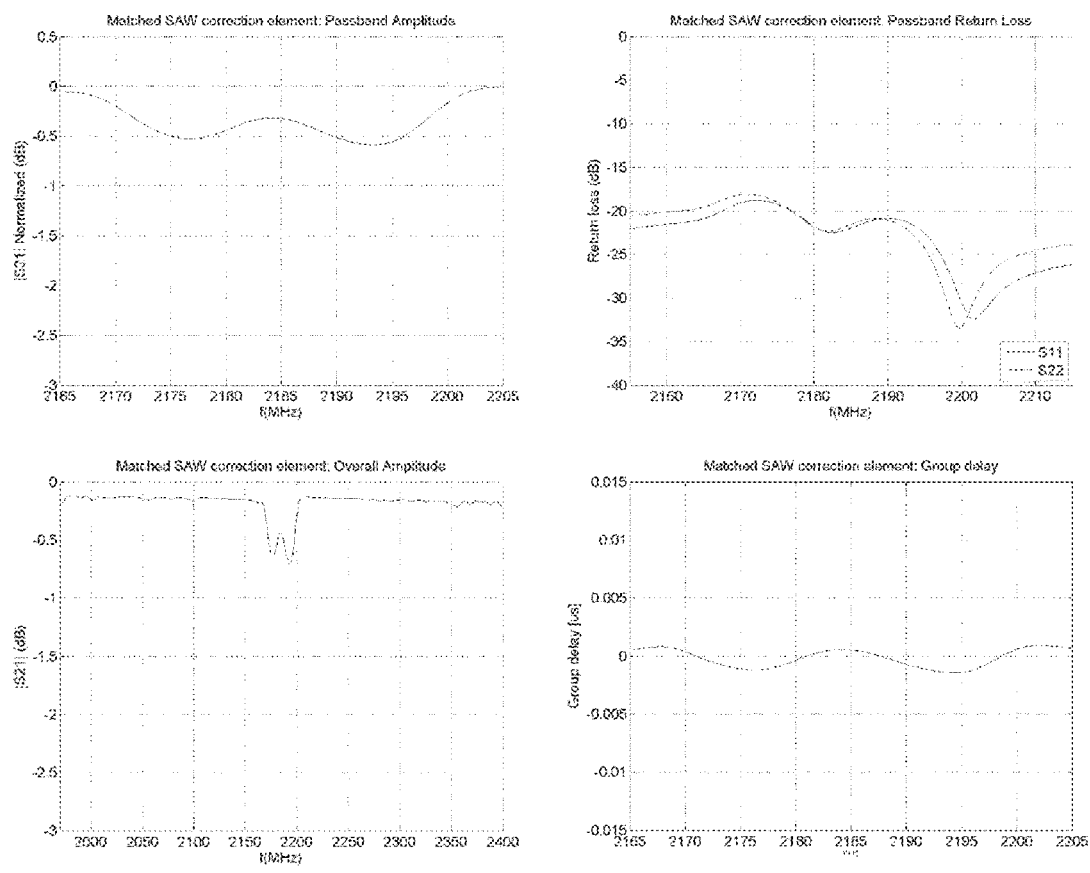
Figure 5:
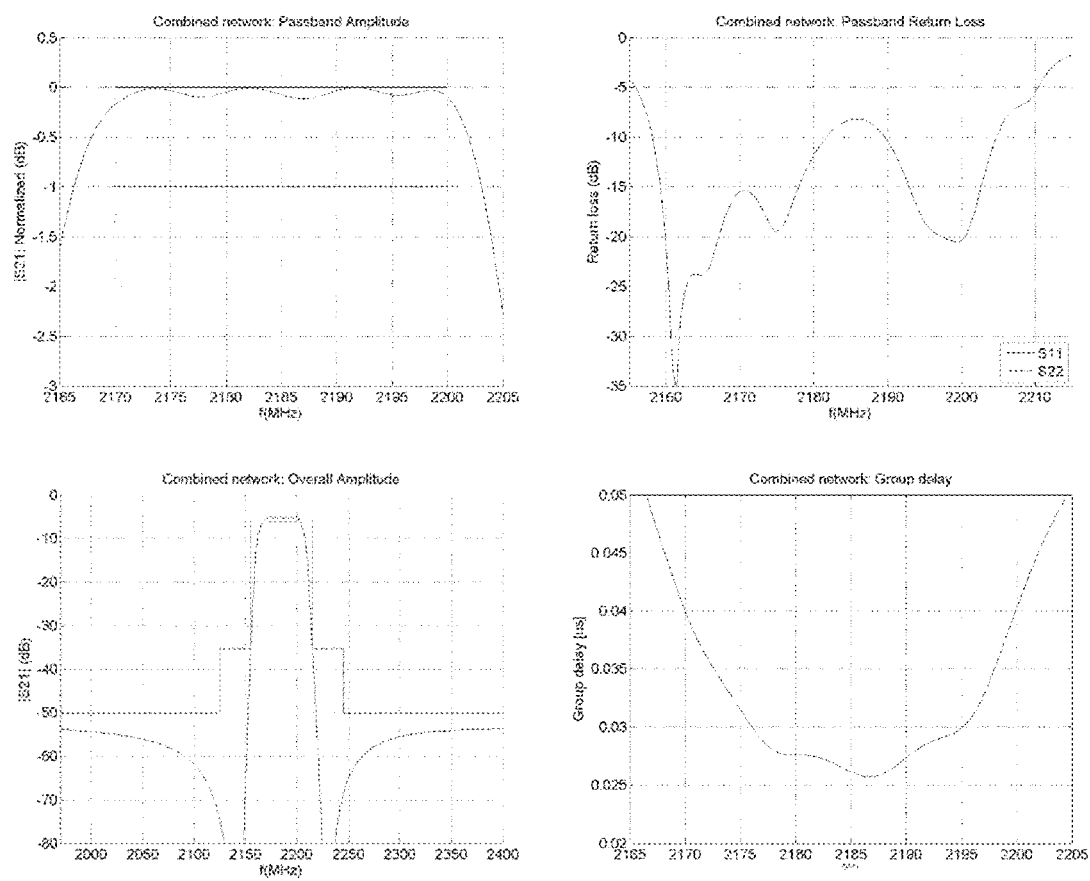

FIG. 4: illustrates the response of a SAW correction unit with inductive and capacitive matching components FIG. 5: illustrates the responses of the SAW IEF after connecting correction units on both sides of the filter.

Figure 1A:
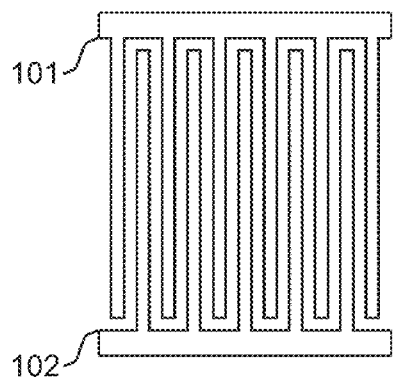
FIG. 1a illustrates the basic electrode shape of a SAW transducer according to the prior art.
Figure 1B:
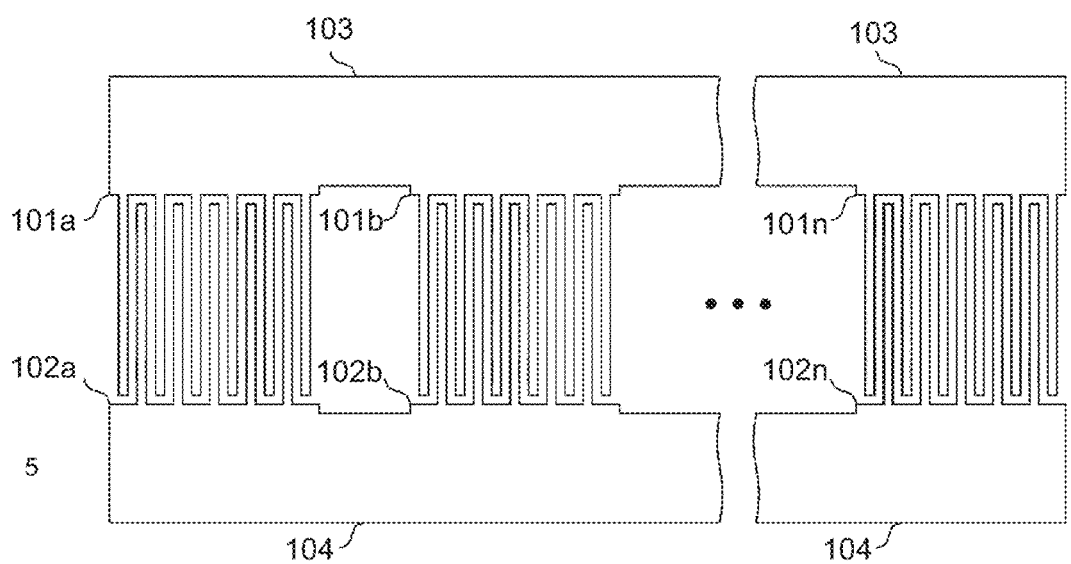
FIG. 1b illustrates one possible embodiment of an arbitrary number of SAW transducers connected through two buses according to the prior art.
Figure 2A:
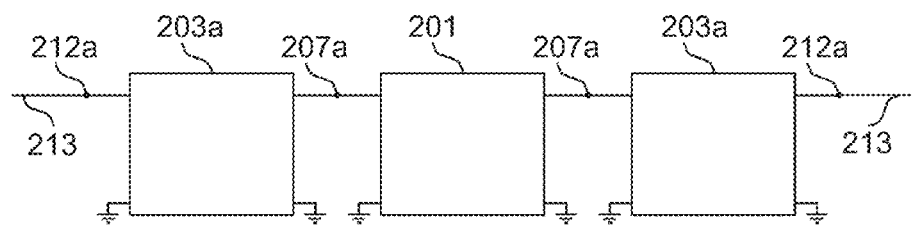
FIG. 2a illustrates a preferred embodiment of the invention.
Figure 2A:
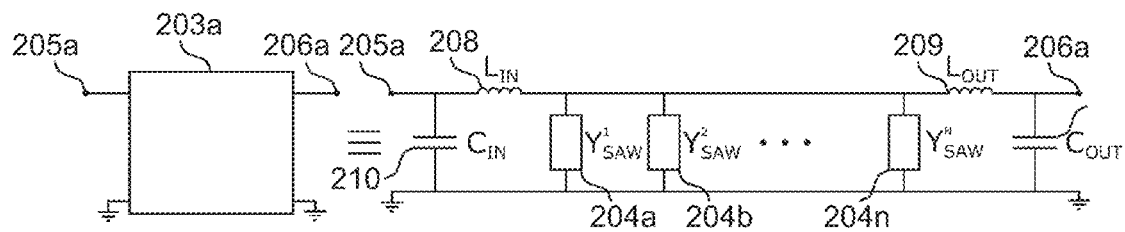

As can be seen form FIG. 2a a correction unit 203 is connected to a filter 201 which in practice will be a band pass filter with known characteristics and distortions. As is illustrated in the lower part of FIGS. 2a and 2b, the correction unit 203a-b may include at least one SAW transducer 204a-n. In addition, inductive elements 208,209 and capacitive elements 210,211 may be included in the correction unit 203 in order to reduce the impedance mismatch of the correction unit in the signal line. As stated above the construction of the SAW-transducer is known to the person skilled in the art and will not be discussed in detail here.

Figure 2B:
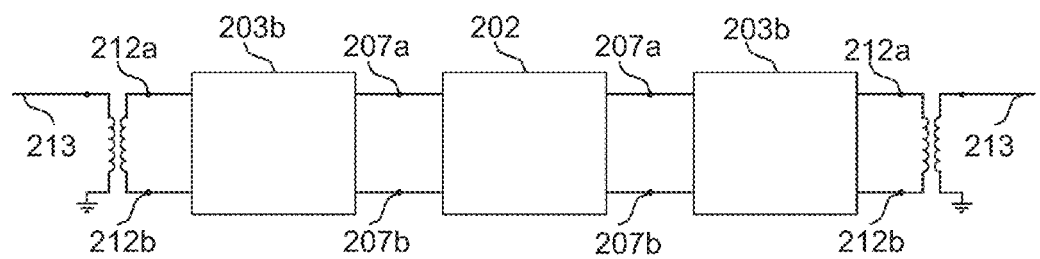
FIG. 2b illustrates an alternative embodiment of the invention.
Figure 2B:
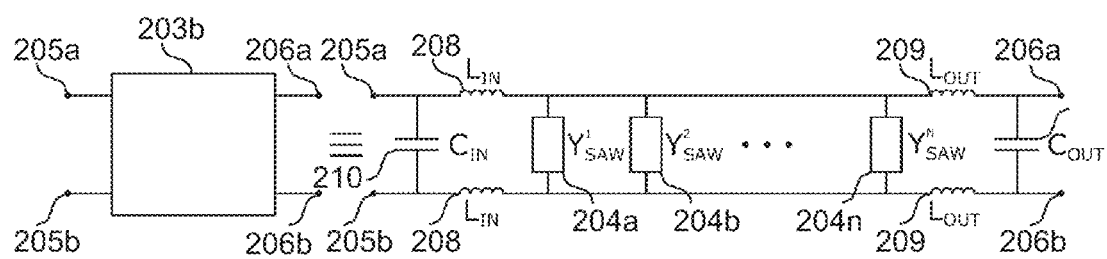

In FIG. 2a the correction units 203a and filter 201 are grounded while FIG. 2b illustrates a balanced embodiment of the invention.

Figure 2C:
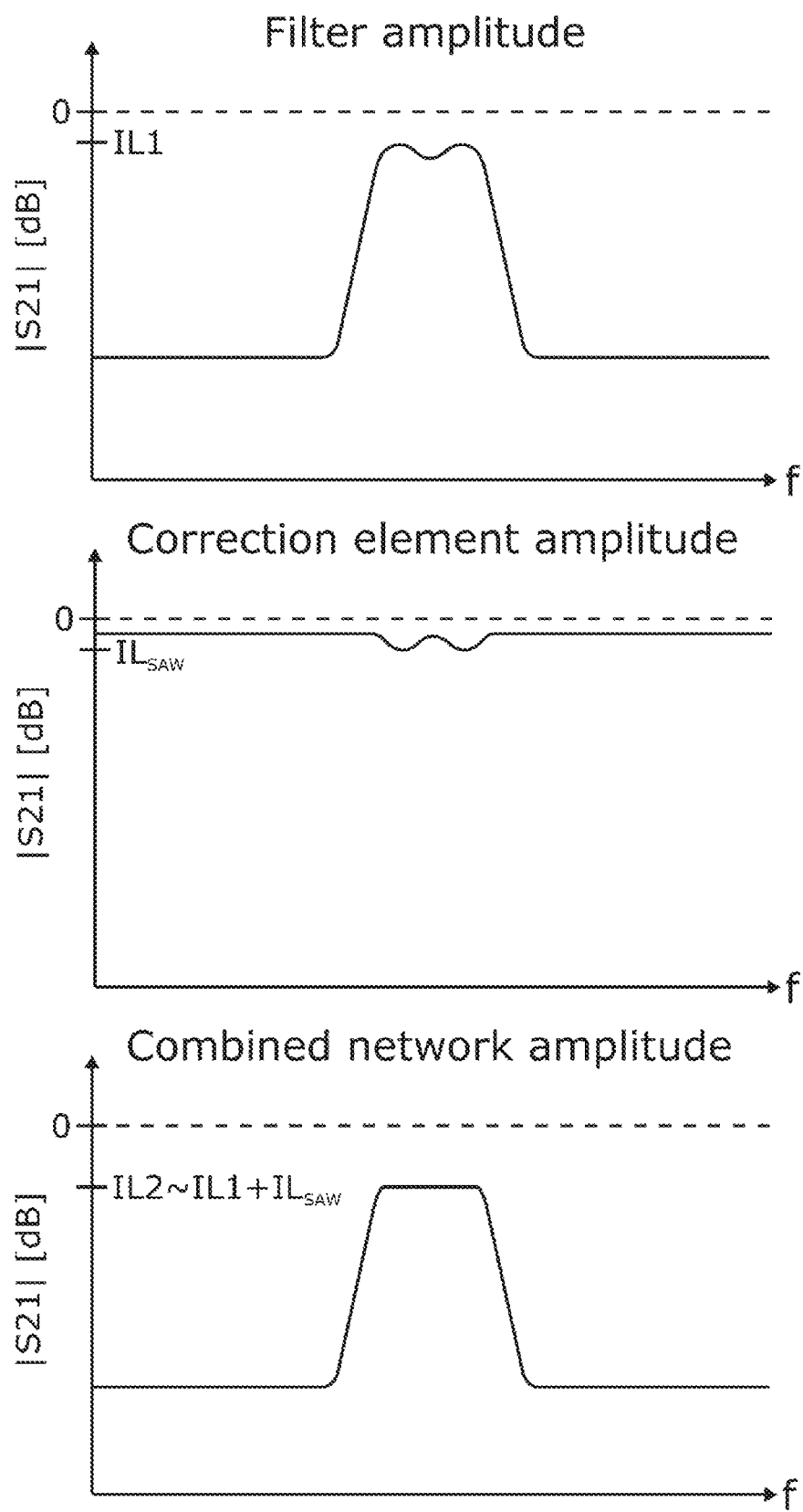
FIG. 2c illustrates the function of the invention.

In FIG. 2c the function of the invention is illustrated where the amplitude response of the filter is shown and its insertion loss IL1 indicated. The SAW transducer in the correction unit 203a,b is arranged in a per se manner known to add a correction signal to the input or output of the filter 201 corresponding to the inverse of the known errors of the filter 201. The resulting, combined signal is shown in the last drawing where the error is removed from the signal. As indicated the correction is achieved through a degradation in insertion loss of the connected network, as indicated by IL2~IL1+IL$_{SAW}$. As illustrated in FIGS. 2a and 2b correction units may be positioned on both sides of the filter.

As is known in the field the acoustic admittance bandwidth of a SAW transducer is limited by the length of the transducer finger pattern and substrate material properties. In applications where the needed dissipation profile bandwidth exceeds the maximum achievable bandwidth of one transducer, the needed bandwidth may be achieved by employing multiple SAW transducers coupled to the filter, each correcting a separate section of the passband. The magnitude of the induced correction is limited by the aperture of the transducer, here defined as the length over which electrode fingers overlap, and substrate material properties. If the needed correction magnitude exceeds the maximum achievable magnitude of one transducer, the correction magnitude may be enhanced by coupling multiple SAW transducers with overlapping dissipation profiles in parallel. Alternatively, the correction magnitude may be diminished by either reducing the transducer aperture or by coupling multiple similar SAW transducers in series. Consequently, by connecting one or more SAW transducers to a RF filter in a manner described above, an arbitrary correction of the total network passband response may be achieved through the sacrifice of insertion loss. To minimize the insertion loss degradation, losses may be introduced to primarily affect passband ripple peaks, thereby flattening the passband to a level near the passband ripple minima. The resulting insertion loss degradation will here be given by the intrinsic loss of the transducer outside the acoustically active frequency range, given by the capacitance of the transducer, and the peak-peak passband ripple of the connected RF filter. This type of loss profile may be realized by connecting the filter to multiple loss inducing SAW transducers, each introducing losses at a ripple peak, or through multi-band transducers with multiple passbands and stop bands, where each passband coincides with a ripple peak. This process is illustrated in FIGS. 2c and 5.

One limitation of the invention is that it will impose degradations in return loss of the network due to impedance mismatch between the filter and the SAW transducers. This mismatch may be reduced by including inductive 208,209 and capacitive 210,211 components as illustrated in FIG. 2a,b. The capacitive elements 210,211 may be realized through the parasitic capacitance of the capsule connector pin to which the SAW transducer bus is connected, in combination with optional capacitive components connected to the ground plane of the capsule. The inductive elements 208,209 can be realized through the bonding wire connecting the SAW transducer bus to the capsule pin in combination optional inductive structures realized on the piezoelectric substrate of the SAW transducer, on a separate PCB or on a ceramic substrate mounted in the capsule. Inductive elements may also be realized through alternate inductive elements known to a person skilled in the art, such as chip inductors or toroid components.

Amplitude perturbations may in practice be induced by the SAW transducers and introduce minor perturbations in the phase of the connected network. The magnitude of the introduced phase dispersion is correlated to the magnitude of the induced amplitude correction through the Kramer-Kronig relations, and may be noticed for severe passband corrections. For the simulation results presented in FIGS. 3-5 a correction of approximately 1 dB was applied to correct the passband amplitude response. The corresponding change in group delay variation and linear phase ripple was 1.2 ns and −0.4 degrees respectively, a respective change of 9% and −3%. The observed perturbation of the phase response will depend on the magnitude and bandwidth of the applied amplitude correction, and is expected to be small for moderate correction magnitudes on the order of a few dB.

Yet another limitation to the invention is that the power handling capabilities of the network may become limited by the SAW transducers if connected to a filter with power handling capabilities exceeding that of the SAW transducers. It is noted that the power handling capabilities of a loss inducing SAW transducer will not be the limiting factor when combined with a SAW impedance element filter (IEF) on the same substrate since the power handling capabilities of a SAW transducer will exceed that of the SAW resonators incorporated in the SAW IEF. A SAW IEF here refers to a filter network composed of connected SAW resonator elements, the filtering response being defined by the topological configuration and frequency dependent impedances of constituent SAW resonators. The power handling capabilities of a SAW resonator will be inferior to that of a SAW transducer of comparable aperture, as the finger pattern in the SAW resonator is subject to a standing wave of increased magnitude in the resonator cavity, whereas the SAW transducer is subject to a traveling SAW of lesser magnitude.

Still yet another limitation to the invention is related to the frequency regime to which passband corrections through loss inducing SAW elements can be applied. This frequency range is limited by the processing techniques used to define the SAW transducers and the SAW velocity of the used piezoelectric substrate, where the approximate applicable frequency range spans from 100 MHz to 10 GHz. In one embodiment of the invention, where SAW correction units are implemented on the same substrate as a connected SAW filter, the aforementioned frequency constraints of the SAW correction unit is not the limiting factor, since the limitations imposed by the processing techniques defining the transducer geometry will affect the SAW transducers and SAW filter equally.

EXAMPLE OF INVENTION EMBODIMENTS

In one embodiment of the invention an electroacoustic filter, examples include but are not limited to transversal SAW filters, SAW impedance element filters (IEF), bulk acoustic wave (BAW) filters and film bulk acoustic resonator (FBAR) filters defined on a piezoelectric substrate, with one input and output terminal, where the input and or output terminal of the filter is connected to one or more loss inducing SAW transducers 204*a*-*n* having two electrodes 101,102 defined on the same piezoelectric substrate, where each loss inducing SAW transducer 204*a*-*n* has one electrode 101*a*-*n* connected to a first bus 103, this bus being connected to both the input or output interface of the filter 207*a*, and the input or output pin of the capsule housing the filter network 212*a*, whereas the other electrode 102*a*-*n* is connected to a second bus 104 connected to ground. The first ungrounded bus 103 may be connected to the filter 207*a* and pin interface 212*a* either through a bonding wire, or through inductive 208,209 and capacitive 210,211 elements. Inductive elements 208,209 may be realized through chip inductors, inductive PCB or ceramic substrates mounted in the capsule or through inductive metallization patterns on the piezoelectric substrate defining the SAW transducers. Capacitive elements 210,211 may be realized through capacitive structures on a printed circuit board (PCB), ceramic substrate or piezoelectric crystal or through chip capacitors connected to the ground plane in the capsule. When integrated on the same piezoelectric substrate, the ungrounded bus may interface the electroacoustic filter directly.

In another embodiment of the invention an arbitrary planar compatible RF filter, examples include but are not limited to electroacoustic filters as exemplified above, lumped-element LC filters, stripline filters and microstrip filters, with one input and output terminal, where the input and or output terminal of the filter is connected to one or more loss inducing SAW transducers 204*a*-*n* having two electrodes 101,102, defined on a separate piezoelectric substrate mounted in the capsule housing the filter network, wherein the SAW transducer electrodes 101*a*-*n*,102*a*-*n* are connected to the RF filter 201, ground plane and input or output terminals of the capsule in a similar fashion as described in the first described embodiment of the invention.

In a further embodiment of the invention one or more loss inducing SAW transducers 204*a*-*n* are mounted in a capsule to form a filter correction module. Each module consists of one or more SAW transducers 204*a*-*n* with two electrodes 101,102 on a piezoelectric substrate mounted in the capsule, where each transducer has one electrode 102*a*-*n* connected to a grounded bus 104 and the other electrode 101*a*-*n* connected to a bus 103 interfacing the input 205*a* and output pin 206*a* of the capsule via a bonding wire, or via an inductive element 208,209 realized either through a bonding wire, through an inductive component such as a chip inductor or inductive PCB or ceramic substrate mounted in the capsule or through an inductive metallized pattern defined on the piezoelectric substrate. The input and or output pin could also be connected to a grounded capacitive element 210,211 such as a chip capacitor in the capsule. One or more loss inducing SAW modules 203*a* may be connected to the input or output terminal of an external arbitrary RF filter module 201 to form a filter network with improved passband frequency selectivity, at the expense of increased insertion loss.

In an alternative embodiment of the invention an arbitrary planar RF filter incorporating shunt connected capacitive elements, examples include but are not limited to lumped-element inductor-capacitor (LC) filters and any planar transmission line filter architecture known to a person skilled in the art, is combined with one or more loss inducing SAW transducers, where the SAW transducers are used to both realize shunt connected capacitive elements in the RF filter, and to selectively introduce losses in the passband of the connected network. Each SAW transducer has two electrodes 101,102, defined on a piezoelectric substrate mounted within the capsule housing the filter network, where one electrode 101 is connected to the interior of the RF filter through a bonding wire and the other electrode 102 to ground through a bonding wire. Loss inducing SAW transducers can be defined on a shared piezoelectric substrate or on separate piezoelectric substrates.

Yet another embodiment of the invention comprises a balanced four port electroacoustic filter, examples include but are not limited to transversal SAW filters, SAW impedance element filters (IEF), bulk acoustic wave (BAW) filters and film bulk acoustic resonator (FBAR) filters defined on a piezoelectric substrate, with two input terminals and two output terminals, where the input and or output terminals are connected to one or more loss inducing SAW transducers 204*a*-*n* having two electrodes 101*a*-*n*,102*a*-*n*, defined on the same piezoelectric substrate, where each loss inducing SAW transducer 204*a*-*n* has one electrode 101*a*-*n* connected to a first bus 103, this bus being connected to both the input or output interface of the filter 207*a*, and the input or output pin of the capsule housing the filter network 212*a*, and the other electrode 102*a*-*n* connected to a second bus 104, this bus being connected to the other input or output terminal of the filter 207*b*, and the other input or output pin of the capsule 212*b*, wherein the two buses 103,104 are connected to the RF filter 202 and input or output terminals of the capsule 212*a*-*b* in a similar fashion as described in the first described embodiment of the invention.

Still yet another embodiment of the invention comprises an arbitrary planar compatible balanced four port RF filter, examples include but are not limited to electroacoustic filters as exemplified in the embodiment above, lumped-element LC filters, stripline filters and microstrip filters, with two input terminals and two output terminals, where the input and or output terminals are connected to one or more loss inducing SAW transducers 204a-n having two electrodes 101,102, defined on a piezoelectric substrate mounted in the capsule housing the filter network, wherein the SAW transducer electrodes 101a-n,102a-n are connected 207a-b to the RF filter 202, and input or output terminals of the capsule 212a-b in a similar fashion as described in the embodiment described above.

The present invention has been shown to provide appropriate correction magnitudes for SAW transducers with realizable apertures on common SAW substrate materials, such as Quartz, LiTaO3 and LiNbO3. A dip in transmission on the order of several dB relative to transmission outside the acoustically active region of the SAW transducer was found to be achievable. Materials and rotations supporting other acoustic wave modes are also considered suitable for the realization of correction elements, examples including but not being limited to pseudo-SAW modes and leaky wave modes bound to the surface.

Simulations have been performed with one loss inducing SAW transducer 204a connected to the input and output of a SAW impedance element filter, where inductive and capacitive elements were included at the input- and output-interface of the connected network to reduce impedance mismatch. FIG. 2c,3,4,5 illustrates the effects and improvements in the filter frequency response that may be obtained according to the invention.

The response of the SAW impedance element filter shown in FIG. 3, where at the top left the SAW IEF passband amplitude response is illustrated. At the top right the SAW IEF return loss response is shown. At the bottom right the overall SAW IEF amplitude is shown and at the bottom right the SAW IEF group delay response is shown.

The electrical response of a correction unit 203a comprising one SAW transducer 204a connected to inductive 208,209 and capacitive elements 210,211 only at the input or output terminal is shown in FIG. 4. FIG. 4, Top left shows the amplitude response of the correction unit, whereas the top right Figure shows its return loss response. The bottom left Figure shows the overall correction unit amplitude, while the bottom right Figure shows its group delay response.

The response of the connected network with one correction unit 203a at the input and output 207a of the SAW impedance element filter is shown in FIG. 5. The top left Figure shows the passband amplitude response of the connected network, whereas the top right Figure shows the return loss response. The bottom left Figure shows the overall amplitude response, while the bottom left shows the group delay response.

As shown in the Figures discussed above, the insertion loss variation in the passband is significantly improved for the connected network. The average insertion loss over the passband of the network is degraded by 1.3 dB. Minor perturbations in the return loss response and group delay variation are also observed for the connected network.

To summarize the present invention relates to a filter correction unit 203a-b for use in RF transmission lines including a band pass filter 201,202 having input and output interfaces mounted in the signal transmission line 213. The filter is a band pass filter chosen so as to transmit signals within a predetermined frequency range, and has a quality factor with known limitations generating a known distortion to the signal, such as amplitude ripple and loss. The correction unit 203a-b is connected between the RF transmission line 213 and the input-or output-interface of the filter, thus allowing it to correct a transmitted signal either before entering, or after passing through the filter.

The correction unit comprises at least one SAW-transducer 204a-n, the transducer or transducers having two electrodes 101,102 on a piezoelectric substrate where a first electrode 101a-n is connected to a first bus 103 and the other electrode 102a-n connected to a second bus 104, wherein the first bus 103 connects said transmission line 213 and RF filter input- or output-interface 207a. The second bus 104 is either connected to ground or used to connect said transmission line 213 with the second input or output filter interface 207b when combined with a balanced four port RF filter 202. The SAW-transducers are preferably provided with electrode finger patterns being adapted or similar, being chosen so as to distort a transmitted signal with a factor being the inverse of said know distortion of the filter.

The second bus 104 may be connected to ground directly or through a common conductor, or may be used to connect a second interface 212b of said transmission line 213 with the second input or output interface 207b of the RF filter when combined with a balanced four port RF filter 202.

The filter correction unit will preferably also include capacitive elements 210,211 between the two buses 103,104, at the input- 205a-b and or output-interface 205a-b of the correction unit 203a-b, and inductive elements 208,209 between the buses 103,104 connecting the SAW transducers 204a-n and the input- 205a-b and output-interface 206a-b of the filter correction unit 203a-b, so as to provide impedance matching of the correction unit 203a-b in the signal line.

The correction unit 203a-b and band pass filter 201,202 may be produced on a common piezoelectric substrate material providing a unitary structure with common interfaces 207a-b.

According to another aspect of the invention the RF filter is provided including a filter correction unit as described above. In this case the band pass filter may be constituted by grounded capacitive filter elements, the capacitive filter elements being realized through at least one of said SAW transducers, each having two electrodes 101,102 on a piezoelectric substrate where the first electrode 101 is connected to the interior of the band pass filter and the second electrode 102 to ground. The SAW transducer or transducers are then both adapted both to distort a transmitted signal with a factor being the inverse of said know distortion of the filter, and to realize the capacitance required to define the band pass filter response, thus having a combined functionality. The filter and correction part being variations of the same type of elements.

The filter may be realized in several different ways, e.g. as a LC filter, or as coupled transmission lines, microstrip transmission lines positioned in a comb-line structure being one potential embodiment. The SAW transducers may be realized on the same substrate as said transmission lines, or on a different substrate.

REFERENCES

[1] M. Yu og V. Miraftab, «Shrinking microwave filters,» *IEEE Microwave Magazine*, pp. 40-54, October 2008.

[2] M. Yu, W.-C. Tang, A. Malarky, V. Dokas, R. Cameron og Y. Wang, «Predistortion Technique for Cross-Coupled Filters and Its Application to Satellite Communication Systems,» *IEEE transactions on microwave theory and techniques*, pp. 2505-2515, December 2003.

[3] A. Padilla, J. Mateu, C. Collado, C. Ernst, J. M. Rius, J. M. Tamayo og J. M. O'Callaghan, «Comparison of lossy filters and predistorted filters using novel software,» i *Microwave Symposium Digest*, Anaheim, CA, 2010.

[4] V. Miraftab og M. Yu, «Advanced Coupling Matrix and Admittance Function Synthesis Techniques for Dissipative Microwave Filters,» *IEEE Transactions on Microwave Theory and Techniques*, pp. 2429-2438, October 2009.

[5] D. P. Morgan, Surface-Wave Devices for Signal Processing, Amsterdam: Elsevier, 1985.

The invention claimed is:

1. A filter correction unit for use with a band pass filter having input and output interfaces connected to a radio frequency transmission line, the band pass filter being chosen so as to transmit signals within a predetermined frequency range having a filter passband response, the band pass filter comprising resonators generating passband amplitude peaks within the filter passband response of the band pass filter, wherein the filter correction unit has a first bus connected to the radio frequency transmission line and to the band pass filter, wherein the filter correction unit comprises at least one surface acoustic wave (SAW) transducer, each SAW transducer having two electrodes on a piezoelectric substrate where a first electrode is connected to the first bus and the other electrode connected to a second bus, a frequency dependent loss of the SAW transducer being adapted to match an amplitude of a transmitted signal with a factor being an inverse of the filter passband response of the band pass filter reducing the amplitude of the passband amplitude peaks to flatten a frequency response of the passband.

2. A radio frequency filter including a filter correction unit according to claim 1, wherein the band pass filter is constituted by grounded capacitive filter elements, the grounded capacitive filter elements being realized through at least one of the SAW transducers, each having two electrodes on the piezoelectric substrate where the first electrode is connected to an interior of the band pass filter and the second electrode to ground, the frequency dependent loss of the SAW transducer being adapted both to match a transmitted signal with a factor being the inverse of the known passband response of the radio frequency filter, and also realizing the capacitance required to define the band pass filter response.

3. The radio frequency filter according to claim 2, wherein the band pass filter is a LC filter.

4. The radio frequency filter according to claim 2, wherein the band pass filter comprises coupled transmission lines in a comb-line structure.

5. The radio frequency filter according claim 2, wherein:
the coupled transmission lines are incorporated in the radio frequency filter; and
the coupled transmission lines are microstrip lines.

6. The radio frequency filter according claim 2, wherein:
the coupled transmission lines are incorporated in the radio frequency filter; and
the coupled transmission lines are strip lines.

7. The radio frequency filter according to claim 2, wherein:
the coupled transmission lines and the SAW transducers are incorporated in the band pass filter; and
the coupled transmission lines and the SAW transducers are located on a single piezoelectric substrate.

8. A radio frequency filter according to claim 2, wherein a dominant acoustic wave mode to which the at least one SAW transducer couples is a pseudo-SAW mode.

9. The radio frequency filter according to claim 2, wherein a dominant acoustic wave mode to which the at least one SAW transducer couples is a leaky wave mode bound to a surface.

10. The filter correction unit according to claim 1, wherein the second bus is connected to ground.

11. The filter correction unit according to claim 1, wherein the band pass filter is produced on a piezoelectric substrate material, and the SAW transducers are produced on a piezoelectric substrate material.

12. The filter correction unit according to claim 1, wherein the first bus is connected to both a first input and output interface of the filter correction unit.

13. The filter correction unit according to claim 1, wherein the second bus is connected to both a second input and output interface of the filter correction unit.

14. The filter correction unit according to claim 1, wherein a dominant acoustic wave mode to which the at least one SAW transducer couples is a pseudo-SAW mode.

15. The filter correction unit according to claim 1, wherein a dominant acoustic wave mode to which the at least one SAW transducer couples is a leaky wave mode bound to a surface.

16. The filter correction unit according to claim 1, including inductive and capacitive elements, the capacitive elements having one end connected to a first transmission line or one of said input or output filter interfaces and the other end to ground, whereas the inductive elements are connected between the first bus and the transmission line or filter interface, the elements being chosen so as to improve the impedance matching of the filter correction unit to the transmission line and filter.

17. The filter correction unit according to claim 1, including inductive and capacitive elements, the capacitive elements being connected between a first and second transmission line or one of said input or output filter interfaces, whereas the inductive elements are connected between the first or second bus and the first or second transmission line or filter interface, the elements being chosen so as to improve the impedance matching of the filter correction unit to the transmission line and the band pass filter, the band pass filter being a balanced four port band pass filter.

18. A filter correction system including two filter correction units according to claim 1, being connected on both said input and output interfaces of the band pass filter.

19. A filter correction unit for use with a band pass filter having input and output interfaces connected to a radio frequency transmission line including a first and second bus, the band pass filter being chosen so as to transmit signals within a predetermined frequency range having a filter passband response, the band pass filter comprising resonators generating passband amplitude peaks within the filter passband response of the band pass filter, wherein the filter correction unit comprises at least one surface acoustic wave (SAW) transducer, each SAW transducer having two electrodes on a piezoelectric substrate where a first electrode is connected to the first bus and the other electrode connected to the second bus and being connected in parallel to the band pass filter along the radio frequency transmission line, a frequency dependent loss of the SAW transducer being adapted to match an amplitude of a transmitted signal with a factor being an inverse of the filter passband response of the band pass filter reducing the amplitude of the passband amplitude peaks to flatten a frequency response of the passband.

* * * * *